United States Patent
Schumann

Patent Number: 5,606,239
Date of Patent: Feb. 25, 1997

[54] COOLING DEVICE FOR ELECTRIC VEHICLE BATTERY CHARGER AND WIRING CONVERTER

[75] Inventor: Anton Schumann, Munich, Germany

[73] Assignee: Bayerische Motoren Werke AG, Germany

[21] Appl. No.: 303,827

[22] Filed: Sep. 9, 1994

[30] Foreign Application Priority Data

Sep. 9, 1993 [DE] Germany ............... 43 30 618.7

[51] Int. Cl.$^6$ ....................................... H02J 7/14
[52] U.S. Cl. .................. 320/3; 336/55; 336/61; 320/5
[58] Field of Search .............. 320/2, 5, 30, 35; 336/55, 61, 60, 58, 59, DIG. 2; 180/65 R

[56] References Cited

U.S. PATENT DOCUMENTS

| | | | |
|---|---|---|---|
| 4,135,593 | 1/1979 | Fowkes | 180/65 R |
| 4,229,687 | 10/1980 | Newman | 320/2 |
| 4,399,200 | 8/1983 | Galloway | 429/23 |
| 4,405,891 | 9/1983 | Galloway | 320/15 |
| 4,415,847 | 11/1983 | Galloway | 320/2 |
| 5,215,834 | 6/1993 | Reher et al. | 429/62 |
| 5,412,304 | 5/1995 | Abbott | 320/2 |
| 5,432,026 | 7/1995 | Sahm et al. | 429/120 |
| 5,483,807 | 1/1996 | Abgrsfelder et al. | 180/65.1 |

FOREIGN PATENT DOCUMENTS

| | | |
|---|---|---|
| 330595 | 7/1976 | Austria . |
| 3701056A1 | 8/1988 | Germany . |
| 40-5244749 | 9/1993 | Japan ............ 320/35 |
| 40-6133412 | 5/1994 | Japan ............ 320/35 |

OTHER PUBLICATIONS

H. Lemme, Tanken an der Steckdose, ELO Oct. 1988, pp. 22–31.

*Primary Examiner*—Edward H. Tso
*Attorney, Agent, or Firm*—Evenson, McKeown, Edwards & Lenahan, P.L.L.C.

[57] ABSTRACT

In a cooling device for a vehicle-internal battery charger and a transformer in electric vehicles, the battery charger and the transformer are mounted on a common cooling panel. The cooling panel is preferably liquid-cooled.

5 Claims, 1 Drawing Sheet

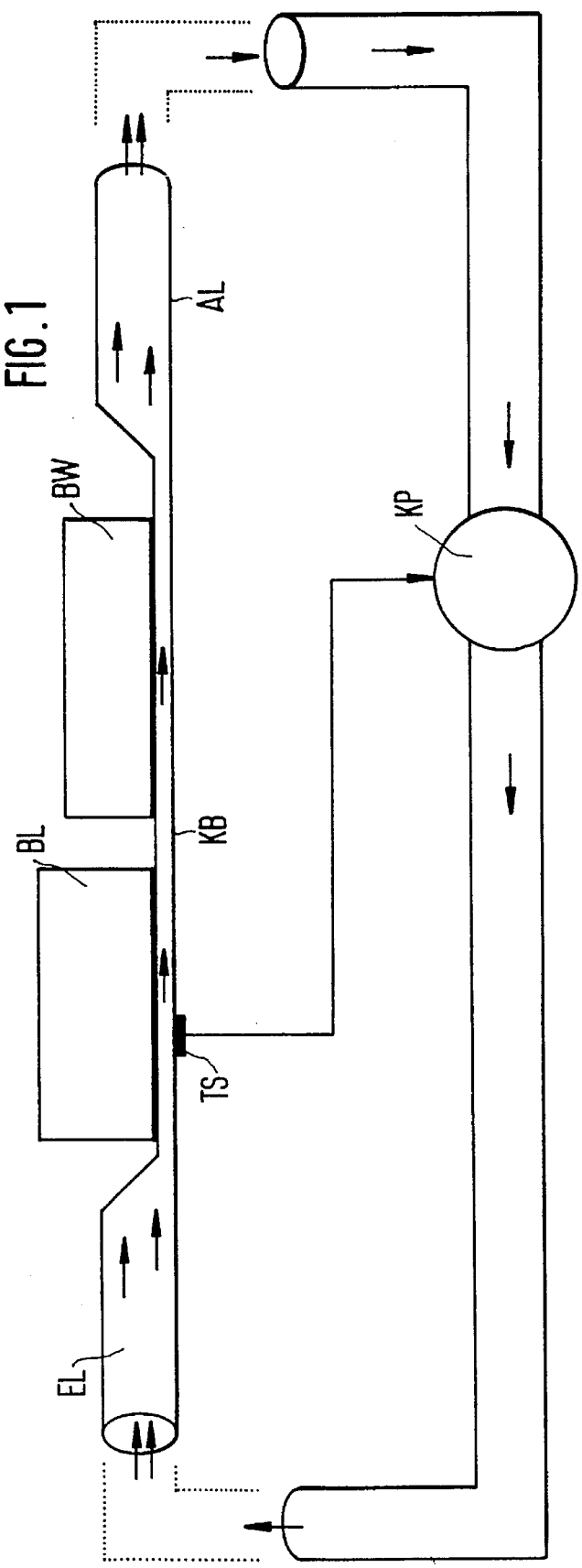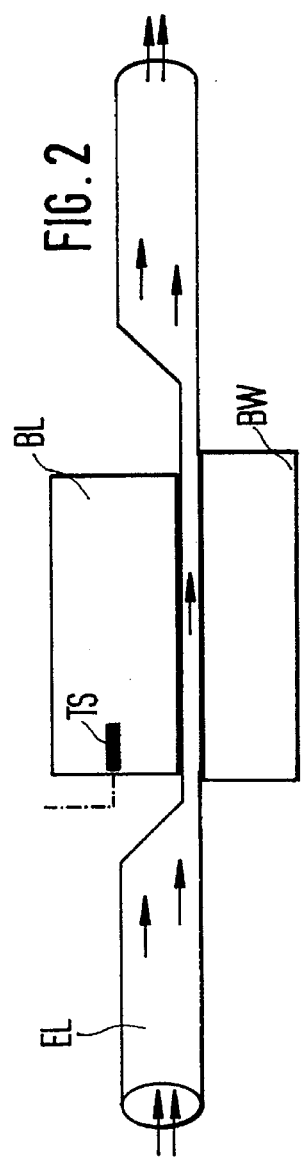

COOLING DEVICE FOR ELECTRIC VEHICLE BATTERY CHARGER AND WIRING CONVERTER

BACKGROUND AND SUMMARY OF THE INVENTION

The present invention relates to a cooling device for a vehicle-internal battery charger and a transformer in electric vehicles.

It is generally known that a vehicle-internal battery charger is provided in electric vehicles for charging the driving battery from a 220 VAC line. In addition, known electric vehicles have a transformer that converts the relatively high voltage from the driving battery into the 12 volts that supply conventional electric vehicle equipment. Both the battery charger and the transformer exhibit a high power loss in the form of heat during operation, so that both electrical devices must be cooled. Separate cooling devices are conventionally provided for battery chargers and transformer. For example, battery chargers are usually air-cooled by being connected to a cooling panel preferably mounted outside the vehicle interior in order to avoid heat accumulation. Both air-cooled and water-cooled cooling panels are used as cooling devices for transformer. The separate cooling devices for the battery charger and the transformer contribute to an undesirable weight increase of the electric vehicle.

An object of the present invention is to improve the range of an electric vehicle by weight reduction.

This goal has been achieved in accordance with the present invention by providing that the battery charger and the transformer are mounted in a common cooling panel.

The present invention is based on the recognition that the battery charger and transformer are not operated simultaneously. The battery charger is operated only when the vehicle is standing still and plugged in. However, the transformer operates only when the vehicle is moving and electric vehicle equipment, such as lights, control devices, and windshield wipers, is switched on. Therefore, a common cooling panel need not be made larger than a cooling panel with which heretofore only the battery charger or the transformer alone was cooled.

With the device according to the present invention, both weight and space are reduced while keeping the same cooling power.

According to a presently preferred embodiment, the cooling panel is liquid-cooled to produce better cooling power than air cooling. As a result, both the battery charger and the transformer can be mounted on a common cooling panel at any desired location, not only outside the vehicle interior.

In the presently preferred embodiment, liquid cooling of the cooling panel is integrated into the cooling circuit for other components as well. Usually a coolant pump is provided to transport the coolant and can be switched on, according to the present invention, during operation of the battery charger and also when the electric vehicle is at rest. Thus, the best possible cooling is assured when the cooling requirement is increased.

The coolant pump can be switched on as a function of temperature while the battery charger is operating. For this purpose, a sensor can, for example, be mounted on the cooling panel, on the battery charger, or in the coolant. The sensor detects the temperature and directs a control unit to drive the coolant pump, with the control unit switching on the coolant pump when a temperature threshold is exceeded. With this improvement according to the invention, the coolant pump is switched on only when needed, thus saving electrical energy.

In another embodiment of the present invention, the coolant pump is also capable of being turned on as a function of time. For this purpose, by way of example, a control unit for driving the coolant pump can comprise a timer that determines the time during which the battery charger is in operation. If the operating time of the battery charger exceeds a set threshold, the coolant pump is switched on. This improvement according to the present invention also saves electrical energy since the coolant pump is only switched on when needed.

BRIEF DESCRIPTION OF THE DRAWINGS

These and other objects, features and advantages of the present invention will become more readily apparent from the following detailed description thereof when taken in conjunction with the accompanying drawings wherein:

FIG. 1 is a schematic coolant circuit with a first embodiment of a cooling device according to the present invention; and FIG. 2 is a schematic showing of a second embodiment of a cooling device according to the present invention.

DETAILED DESCRIPTION OF THE DRAWINGS

In FIG. 1, a hollow cooling panel KB is integrated into a closed coolant circuit, traversed by a coolant from an inlet EL to an outlet AL. In addition, a coolant pump KP is provided in the coolant circuit, through which the coolant is transported in the direction indicated by the arrows. Battery charger BL and transformer BW are mounted side-by-side on the hollow cooling panel KB so that the best possible heat loss is achieved. A temperature sensor TS is mounted on the side of cooling panel KB opposite the mounting surface of the battery charger, and connected to coolant pump KP which can contain a conventional control unit (not shown).

FIG. 2 shows another mounting device according to the present invention in which first the temperature sensor TS is mounted, for example, in the vicinity of electrical power consumers, and secondly battery charger BL and transformer BW are opposite one another. This second embodiment is more economical of space than the first described embodiment, with the battery charger BL and transformer BW mounted side by side. The type of mounting can be chosen depending on the requirement.

If the battery charger is in operation while a vehicle is at rest and temperature sensor TS detects a temperature that is greater than a preset temperature threshold, the coolant pump KP, which is usually shut off with the vehicle at rest, is switched on. When the temperature again drops below the preset temperature threshold as a result of the increased transport of coolant, the coolant pump is switched off again.

During operation of the electric vehicle, first the coolant pump KP is switched on in any event and the battery charger BL is switched off, so that all of the cooling power of cooling panel KB is used exclusively for cooling transformer BW.

Thus, by using only one cooling panel for both the battery charger and the transformer, the best possible cooling is ensured, with weight, space, and flow loss reduction all being achieved simultaneously.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. A cooling device for an electric vehicle-internal battery charger and a transformer with an operational period different from that of the battery charger comprising a common cooling panel at which the battery charger and the transformer are operatively mounted.

2. The cooling device according to claim 1, wherein the cooling panel is liquid-cooled.

3. The cooling device according to claim 2, wherein a coolant pump is operatively connected with the cooling panel for transporting coolant and configured to be turned on during operation of battery charger when the electric vehicle is at rest.

4. The cooling device according to claim 3, wherein the coolant pump is configured to be switched on as a function of temperature.

5. The cooling device according to claim 3, wherein the coolant pump is configured to be switched on as a function of time.

* * * * *